(12) United States Patent
Chiu

(10) Patent No.: US 7,956,655 B1
(45) Date of Patent: Jun. 7, 2011

(54) OUTPUT PAD SYSTEM AND PAD DRIVING CIRCUIT THEREOF

(75) Inventor: Chun-Yu Chiu, Sinshih Township, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 12/659,884

(22) Filed: Mar. 24, 2010

(51) Int. Cl.
*H03B 1/00* (2006.01)

(52) U.S. Cl. ........ 327/108; 327/112; 327/170; 327/263; 326/33; 326/83

(58) Field of Classification Search .................. 327/108, 327/111–112, 170, 172, 263, 264, 436, 437; 326/31, 33, 34, 82–83, 85–87
See application file for complete search history.

(56) References Cited

U.S. PATENT DOCUMENTS

| | | | | |
|---|---|---|---|---|
| 4,612,466 A | * | 9/1986 | Stewart | 327/437 |
| 6,184,703 B1 | * | 2/2001 | Vest et al. | 326/27 |
| 6,489,807 B2 | * | 12/2002 | Genna et al. | 326/56 |

* cited by examiner

*Primary Examiner* — An T Luu
(74) *Attorney, Agent, or Firm* — Rabin & Berdo, PC

(57) ABSTRACT

A pad driving circuit includes an output control circuit, a voltage pump circuit, a first buffer series, and a second buffer series. The output control circuit controls whether a pad circuit can pass an input signal, in which the output control circuit enables the pad circuit to output the input signal when an enable signal is asserted. The voltage pump circuit generates a negative supply voltage having voltage less than a zero volt. The first buffer series, electrically connected between the output control circuit and the pad circuit, drives the pad circuit with a positive supply voltage and the negative supply voltage from the voltage pump circuit. The second buffer series drives the pad circuit with a ground voltage and the positive supply voltage.

16 Claims, 5 Drawing Sheets

US 7,956,655 B1

OUTPUT PAD SYSTEM AND PAD DRIVING CIRCUIT THEREOF

BACKGROUND

1. Field of Invention

This disclosure relates to a pad driving circuit to drive a pad circuit of a input/output system.

2. Description of Related Art

The switching or transition time of an output signal, referred to as the slew rate, describes the rate at which the voltage of the output signal changes with respect to time (dv/dt). Ideally, the slew rate of the circuit would be infinitely high, causing the output signal to change from one logic state to the other logic state instantaneously. However, due to natural effects and energy storage of the components connected to the output pads of the IC, the logic state cannot change instantaneously. A great amount of time required for the output signal to transition from one logic state to the other logic state reduces the switching speed of the IC.

Modern ICs require high switching speeds. For example, ICs used in signal communication applications must comply with the applicable communication specifications and protocols. Many of these protocols, such as small computer standard interface (SCSI), the personal computer interface (PCI) bus interconnect standards, and the mobile driver IC, specify drive signal strength, signal delay time from input to output, and the slew rates of the output signal. It may be particularly difficult to meet these specifications under circumstances where the extent of the load which may be connected to the output pads of a communication IC varies substantially.

Therefore, there is a need for a new pad driving scheme which can improve the pad timing without enlarging the pad size.

SUMMARY

According to one embodiment of the present invention, a pad driving circuit includes an output control circuit, a voltage pump circuit, a first buffer series, and a second buffer series. The output control circuit controls whether a pad circuit can pass an input signal, in which the output control circuit enables the pad circuit to output the input signal when an enable signal is asserted. The voltage pump circuit generates a negative supply voltage having voltage less than a zero volt. The first buffer series, electrically connected between the output control circuit and the pad circuit, drives the pad circuit with a positive supply voltage and the negative supply voltage from the voltage pump circuit. The second buffer series drives the pad circuit with a ground voltage and the positive supply voltage.

According to another embodiment of the present invention, an output pad system includes a pad circuit, an output control circuit, a voltage pump circuit, a first buffer series, and second buffer series. The output control circuit controls whether the pad circuit can pass an input signal, in which the output control circuit enables the pad circuit to output the input signal when an enable signal is asserted. The voltage pump circuit generates a negative supply voltage, in which the voltage of the negative supply voltage is less than a zero volt. The first buffer series, electrically connected between the output control circuit and the pad circuit, drives the pad circuit with a positive supply voltage and the negative supply voltage from the voltage pump circuit. The second buffer series drives the pad circuit with a ground voltage and with the positive supply voltage.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
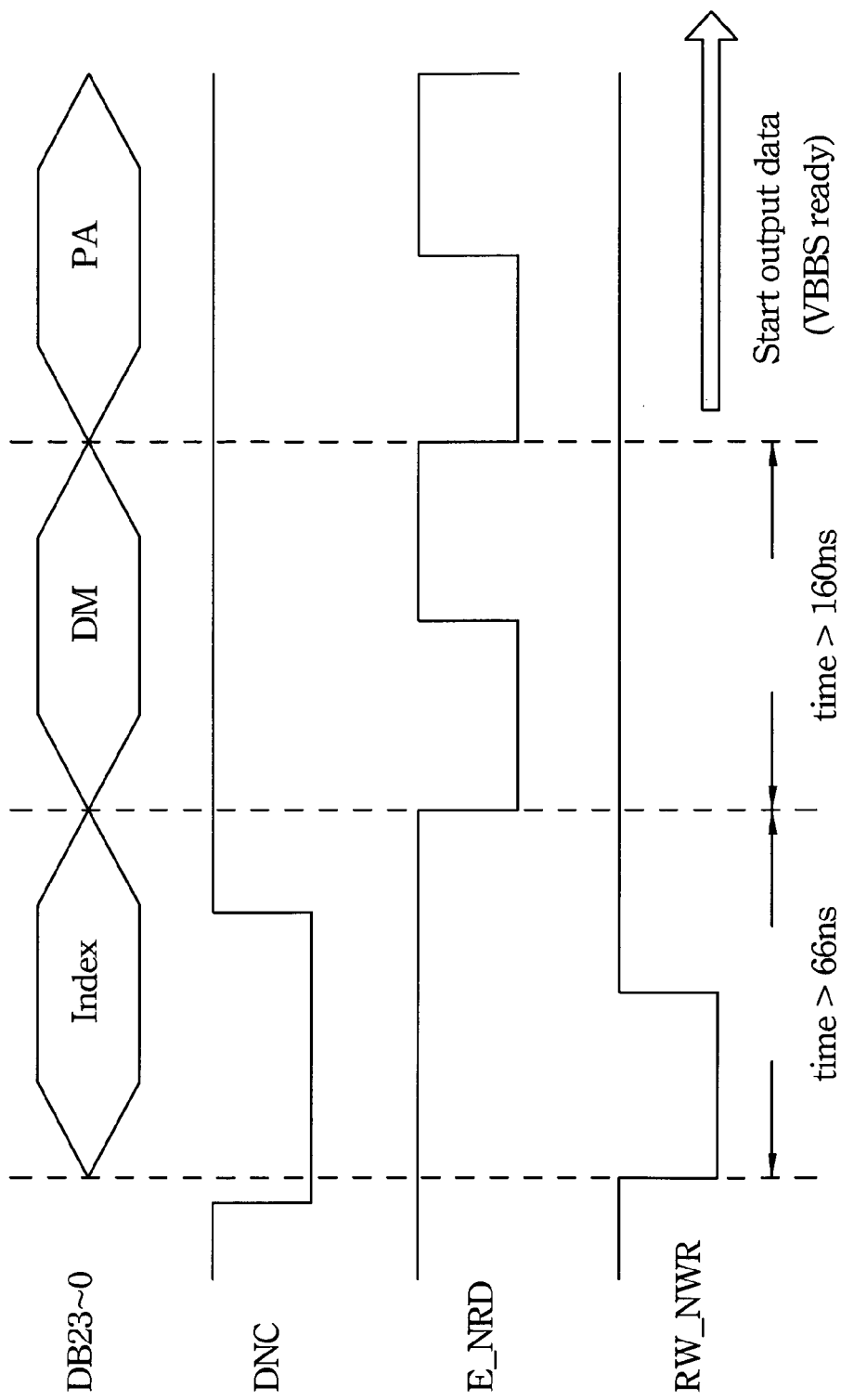
FIG. 1A shows the signal protocol of the mobile phone according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The response time or transition time of the output pad can be reduced by driving the output pad with a negative supply voltage generated by the voltage pump circuit, and the operation speed of the whole integrated circuit is thus increased, as presented by the following embodiments.

Figure 1B:
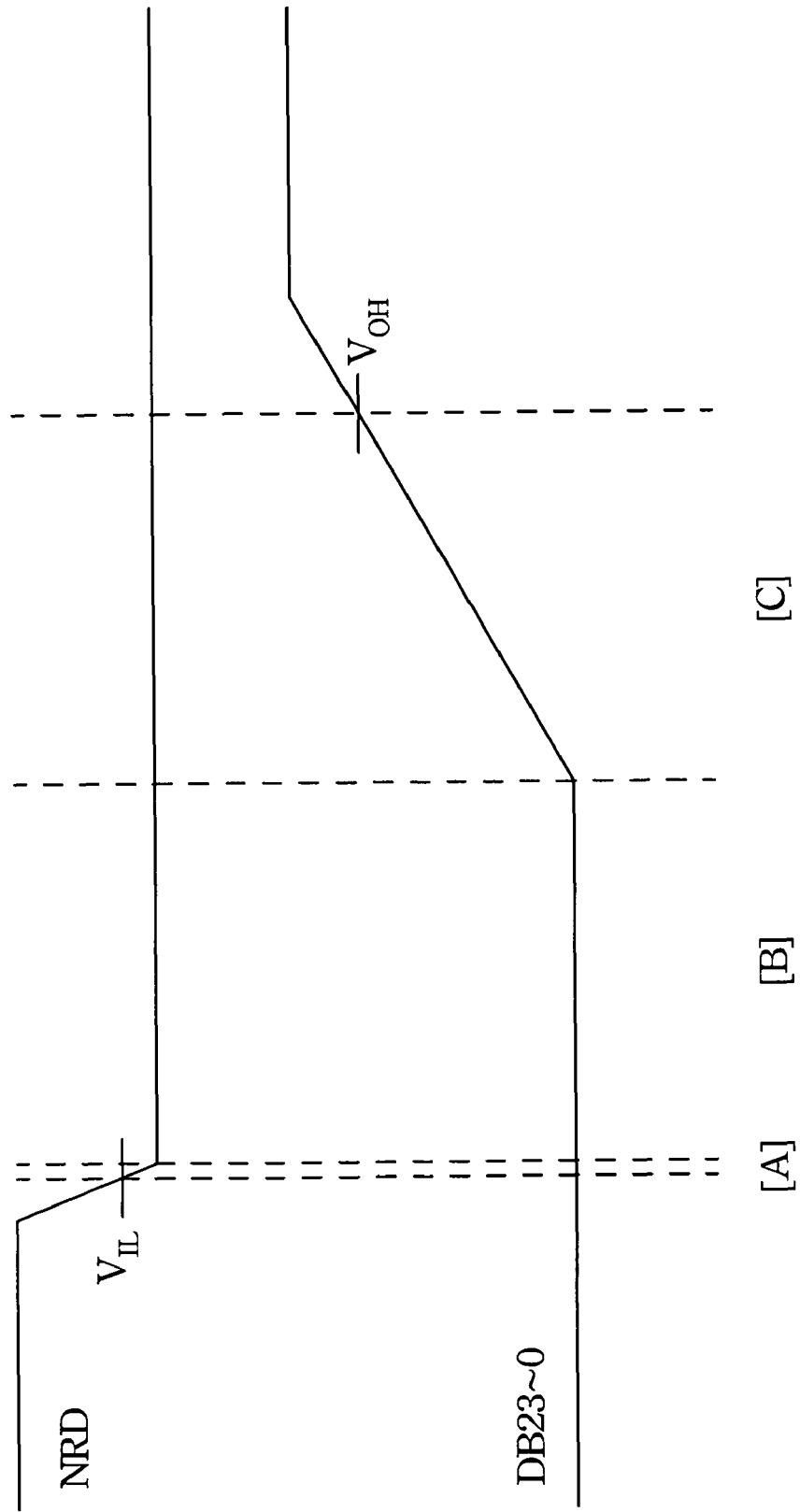
FIG. 1B shows the signal timing sequence of the mobile phone according to one embodiment of the present invention.

Please refer to both FIG. 1A and FIG. 1B. FIG. 1A shows the signal protocol of the mobile phone according to one embodiment of the present invention, and FIG. 1B shows the signal timing sequence of the mobile phone according to one embodiment of the present invention. The DNC signal, representing the information carried by the DB bus being a command or data, is sampled when the RW_NWR signal is asserted (logic low) in the Index cycle, then the dummy read cycle DM proceeds. The output pad should be ready to output the data at the PA cycle where the E_NRD signal provides the rising edge or the falling edge for the host to read data after the previous Index and DM cycles. For example, if the index cycle and the dummy read cycle DM require 66 ns and 160 ns respectively, then the negative supply voltage VBBS should be ready at 226 ns which is the sum of 66 ns and 160 ns.

In FIG. 1B, period B is the operation time employed by the logic circuit to perform the logic function once the NRD signal is asserted (at logic low level). The result is outputted by the output pad at cycle C after the logic function is done. The quicker the DB 23~0 from the output pad rises to the $V_{OH}$, the shorter the operation time of the mobile phone is.

Figure 2A:
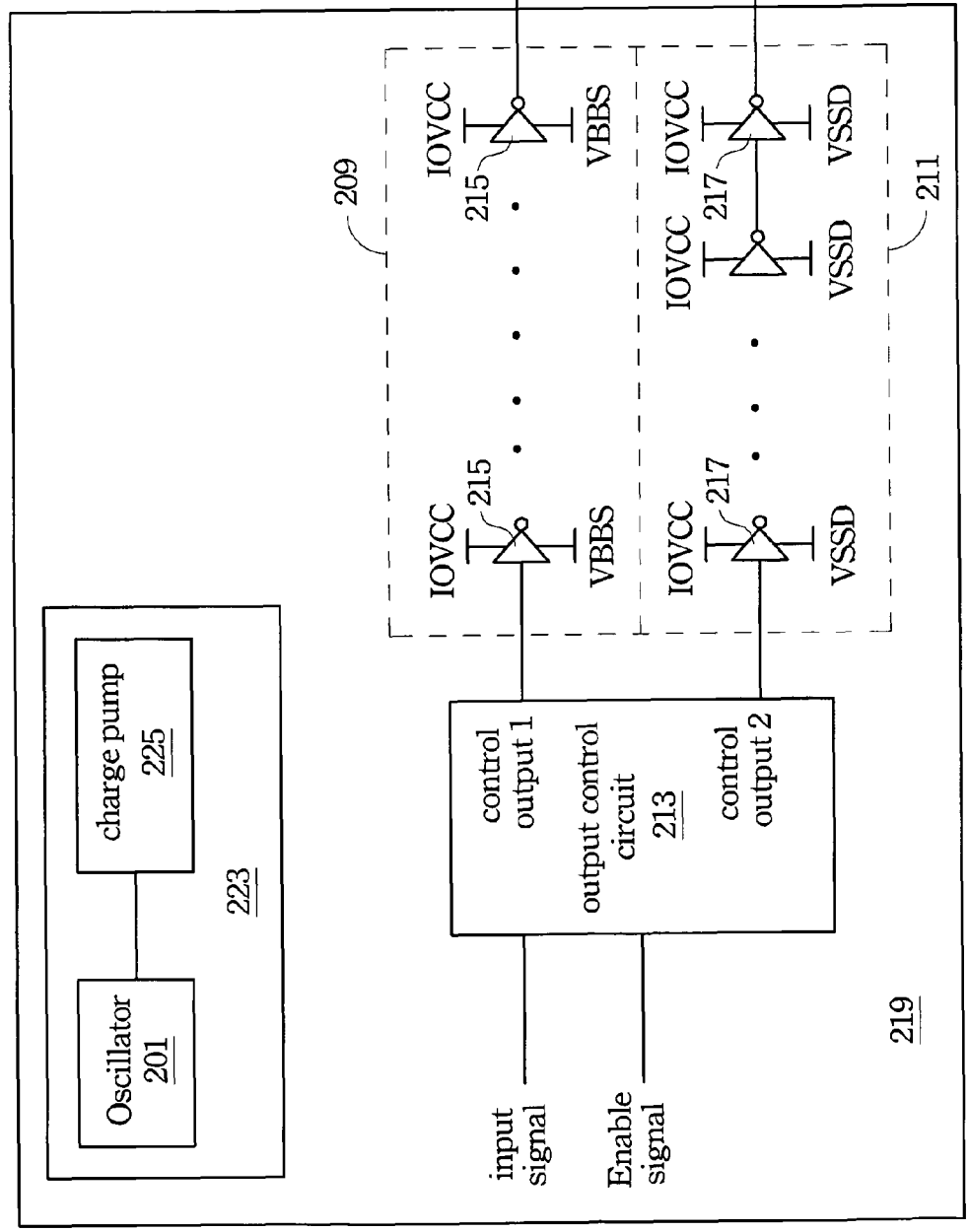
FIG. 2A shows the circuit diagram of the output pad system according to one embodiment of the present invention.

FIG. 2A shows the circuit diagram of the output pad system according to one embodiment of the present invention. The output pad system 229 includes the pad driving circuit 219 and the pad circuit 221 which include a PMOS M1 driven by the first buffer series 209 and a NMOS M2 driven by the second buffer series 211.

The output control circuit 213 controls whether the pad circuit 221 can pass an input signal, in which the output control circuit 213 enables the pad circuit 221 to output the input signal when an Enable signal is asserted (logic high level for example). For example, the output control circuit 213 turns off the PMOS M1 and the NMOS M2 to float the pad output port when the Enable signal is at low level voltage such as 0 volt, and turns on one of the PMOS M1 and the NMOS M2 to pass the input signal.

The second buffer series 211 includes an odd number of second inverters 217 receiving the positive supply voltage IOVCC from the external system and the ground voltage VSSD from the ground terminal, therefore, the second buffer series 211 drives the pad circuit 221 with the positive supply voltage IOVCC and the ground voltage VSSD. The PMOS and the NMOS (not shown) of the inverter 217 in the second buffer series 211 do not turn on simultaneously because the voltage of the control output 2 received by the PMOS and NMOS of the inverter 217 is substantially equal to the positive supply voltage IOVCC or the negative supply voltage VSSD, which reduces the short circuit current.

The first buffer series 209, electrically connected between the output control circuit 213 and the pad circuit 221 for passing an inverted input signal, includes an even number of first inverters 215. The first buffer series 209 drives the pad circuit 221 with the positive supply voltage IOVCC and the negative supply voltage VBBS generated from the voltage pump circuit 223. The PMOS and the NMOS (not shown) of the first inverter 215 in the first buffer series 209 can be turned on simultaneously and cause the short circuit current because the voltage of the control output 1 received by NMOS is greater than the negative supply voltage VBBS. Therefore, the size of the inverter 215 near the output control circuit 213 is decreased to reduce the short circuit current.

Figure 2B:
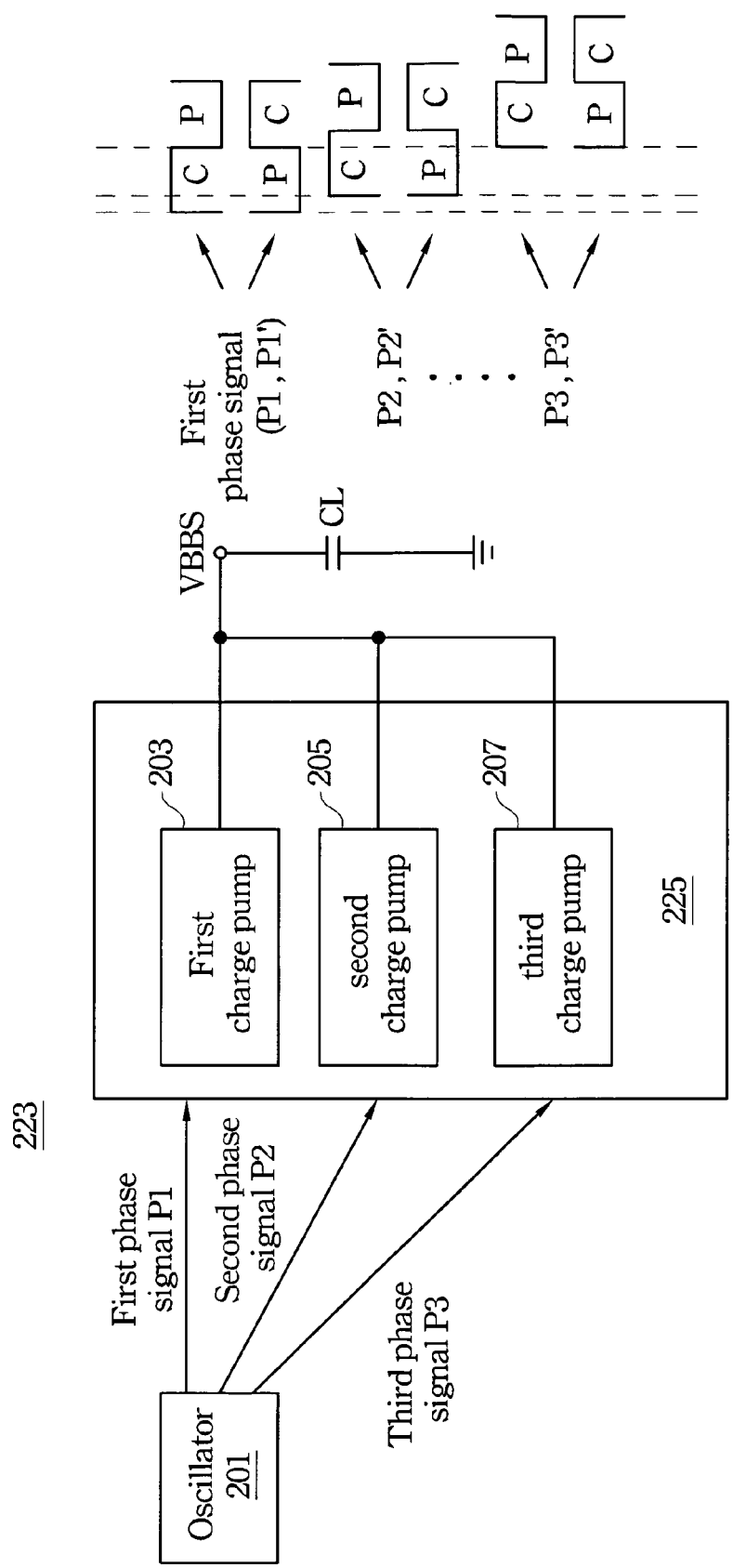
FIG. 2B shows the block diagram of the voltage pump circuit according to one embodiment of the present invention.

The voltage pump circuit 223 generates the negative supply voltage VBBS having voltage less than a zero volt (0 Volt), such as −1 V. The voltage pump circuit 223 includes an oscillator 201 and the charge pump set 225. The oscillator 201, such as a three stage ring oscillator shown in FIG. 2B and FIG. 2C, includes a first inverter 301 outputting the first phase signal P1, a second inverter 303 outputting the second phase signal P2, and a third inverter 305 outputting the third phase signal P3, in which the second inverter 303 is electrically connected between the first inverter 301 and the third inverter 305, while the third inverter 305 is electrically connected to the first inverter 301. These three phase signals (P1, P2, P3) have phases different with each other, that is, the second phase signal P2 lags the first phase signal P1, while the third phase signal P3 lags the second phase signal P2.

The charge pump set 225 converts the positive supply voltage IOVCC form the external system into the negative supply voltage VBBS according to a voltage level of the first phase signal P1. This charge pump set 225 includes the first charge pump 203, the second charge pump 205, and the third charge pump 207 (shown in FIG. 2B) which receive the first phase signal P1, the second phase signal P2, and the third phase signal P3, respectively.

Figure 2C:
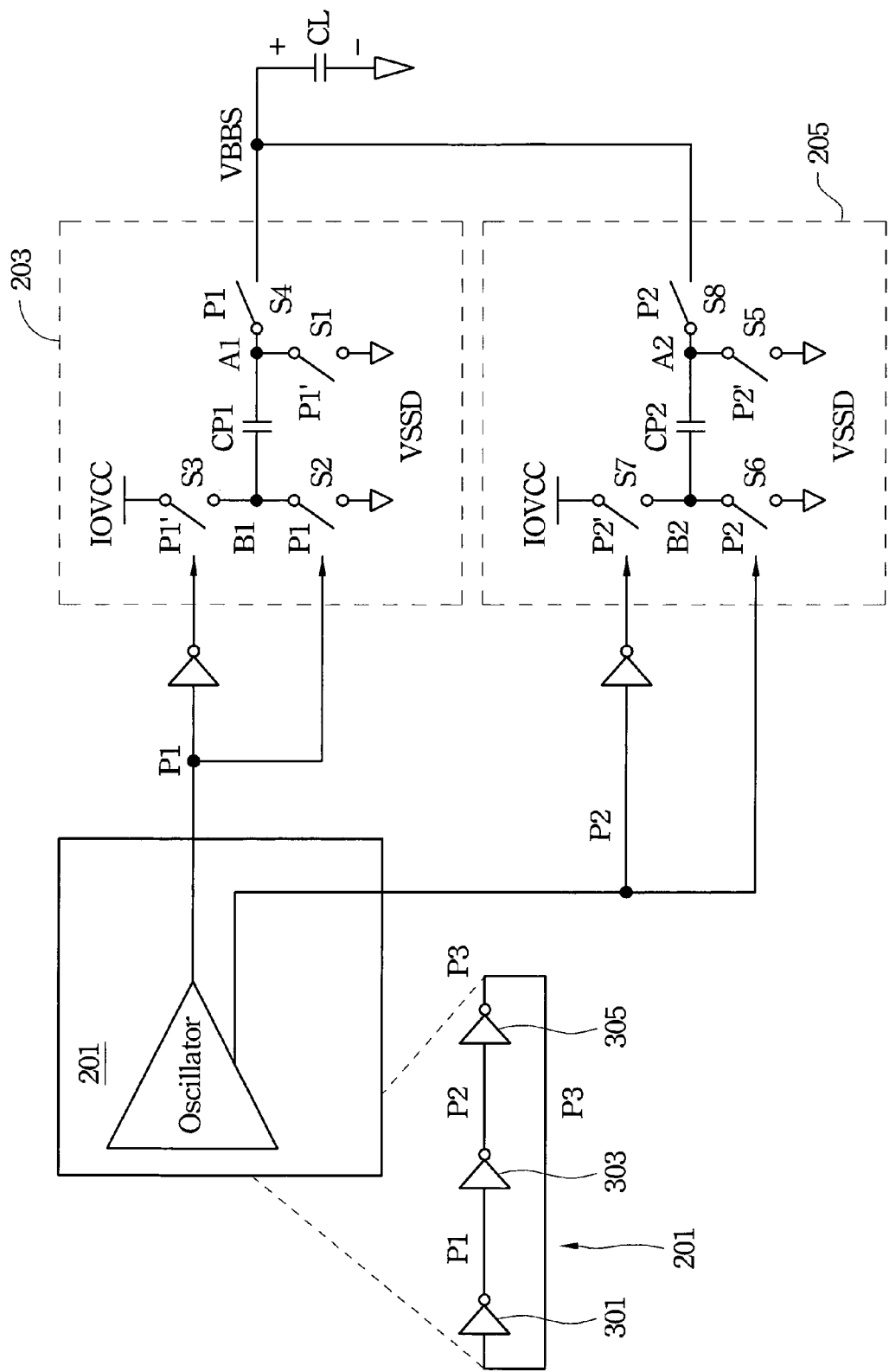
FIG. 2C shows the circuit diagram of the voltage pump circuit according to one embodiment of the present invention.

In more detail, the first charge pumps shown in FIG. 2C include a first storage capacitor CP1, a first switch S1, a second switch S2, a third switch S3, and a fourth switch S4.

The first switch S1, electrically connected between a first end A1 of the first storage capacitor CP1 and a ground terminal providing the ground voltage VSSD, is conductive or not according to an inverted first phase signal P1' which is inverted form the first phase signal P1. The third switch S3, electrically connected to the second end B1 of the first storage capacitor CP1 and the supply terminal providing the positive supply voltage IOVCC, is conductive or not according to the inverted first phase signal P1', too. The first storage capacitor CP1 is charged by the positive supply voltage IOVCC when the inverted first phase signal P1' conducts the first switch S1 and the third switch S3, and the voltage IOVCC is stored in the capacitor CP1 in this stage.

The second switch S2, electrically connected between a second end B1 of the first storage capacitor CP1 and the ground terminal providing the ground voltage VSSD, is conductive or not according to the first phase signal P1. The fourth switch S4, electrically connected between a load CL and the first end A1 of the first storage capacitor CP1, is conductive or not according to the first phase signal P1, too.

The voltage on the first end A1 is converted near to a negative voltage (−IOVCC) when the second switch S2 and the third switch S4 are conducting because the polarity on the second end B1 of the first storage capacitor CP1 is reversed. Therefore, the negative supply voltage VBBS is provided on the first end A1. In fact, the converted voltage value on the first end A1 is related to the capacitance ratio of the first storage capacitor CP1 over the load capacitor CL. The greater the capacitance ratio is, the closer the converted voltage value on the first end A1 is drawn to −IOVCC.

The second charge pump 205 includes a second storage capacitor CP2, a fifth switch S5, a sixth switch S6, a seventh switch S7, and a eighth switch S8. The second charge pump 205 receives the second phase signal P2 having phase different from that of the first phase signal P1, while the second charge pump 205 operates similar to the first charge pump 203. The negative supply voltage VBBS can be refreshed frequently to maintain its voltage value because the node providing the negative supply voltage VBBS can be refreshed by the first charge pump 203 and the second charge pump 205 at a different time.

According to the above embodiments, the pad driving circuit and the output pad system use the negative supply voltage to drive the PMOS of the output pad, which increases the current of the PMOS of the output pad. The charging time is reduced with the increased current, and the transition speed as well as the driving ability of the output pad is increased as a result, which speeds up the integrate circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pad driving circuit, comprising:
    an output control circuit for controlling whether a pad circuit can pass an input signal, wherein the output control circuit enables the pad circuit to output the input signal when an enable signal is asserted;
    a voltage pump circuit for generating a negative supply voltage, wherein the voltage of the negative supply voltage is less than a zero volt;
    a first buffer series, electrically connected between the output control circuit and the pad circuit for passing an inverted input signal, wherein the first buffer series drives the pad circuit with a positive supply voltage and the negative supply voltage from the voltage pump circuit; and
    a second buffer series for driving the pad circuit with a ground voltage and with the positive supply voltage.

2. The pad driving circuit as claimed in claim 1, wherein voltage pump circuit comprises:
    an oscillator for generating at least a first phase signals; and
    a charge pump set for generating the negative supply voltage, wherein the charge pump set converts the positive supply voltage into the negative supply voltage according to a voltage level of the first phase signal.

3. The pad driving circuit as claimed in claim 2, wherein the oscillator is a multiple stage oscillator comprising:
   a first inverter for outputting the first phase signal;
   a second inverter, electrically connected to the first inverter, for outputting a second phase signal; and
   a third inverter, electrically connected between the second inverter and the first inverter, for outputting a third phase signal,
   whereby phases of the first phase signal, the second phase signal, and the third phase signal are different.

4. The pad driving circuit as claimed in claim 3, wherein the charge pump set comprises a first charge pump which comprises:
   a first storage capacitor;
   a first switch being conductive or not according an inverted first phase signal inverted form the first phase signal, wherein the first switch is electrically connected between a first end of the first storage capacitor and a ground terminal providing the ground voltage;
   a second switch being conductive or not according the first phase signal, wherein the second switch is electrically connected between a second end of the first storage capacitor and the ground terminal;
   a third switch being conductive or not according the inverted first phase signal, wherein the third switch is electrically connected to the second end of the first storage capacitor and a supply terminal providing the positive supply voltage; and
   a fourth switch being conductive or not according the first phase signal, wherein the fourth switch is electrically connected between a load and the first end of the first storage capacitor.

5. The pad driving circuit as claimed in claim 4, wherein the charge pump set further comprises a second charge pump which comprises:
   a second storage capacitor;
   a fifth switch being conductive or not according an inverted second phase signal inverted form the second phase signal, wherein the fifth switch is electrically connected between a first end of the second storage capacitor and the ground terminal providing the ground voltage;
   a sixth switch being conductive or not according to the second phase signal, wherein the sixth switch is electrically connected between a second end of the second storage capacitor and the ground terminal;
   a seventh switch being conductive or not according the inverted second phase signal, wherein the seventh switch is electrically connected to the second end of the second storage capacitor and the supply terminal providing the positive supply voltage; and
   an eighth switch being conductive or not according the second phase signal, wherein the eighth switch is electrically connected between the load and the first end of the second storage capacitor.

6. The pad driving circuit as claimed in claim 1, wherein the first buffer series drives a P channel Metal-Oxide-Semiconductor field effect transistor of the pad circuit.

7. The pad driving circuit as claimed in claim 6, wherein the first buffer series comprises an even number of first inverters for receiving the positive supply voltage and the negative supply voltage to drive the pad circuit.

8. The pad driving circuit as claimed in claim 7, wherein the second buffer series comprises an odd number of second inverters for receiving the positive supply voltage and the ground voltage to drive the pad circuit.

9. An output pad system, comprising:
   a pad circuit;
   an output control circuit for controlling whether the pad circuit can pass an input signal, wherein the output control circuit enables the pad circuit to output the input signal when an enable signal is asserted;
   a voltage pump circuit for generating a negative supply voltage, wherein the voltage of the negative supply voltage is less than a zero volt;
   a first buffer series, electrically connected between the output control circuit and the pad circuit for passing an inverted input signal, wherein the first buffer series drives the pad circuit with a positive supply voltage and the negative supply voltage from the voltage pump circuit; and
   a second buffer series for driving the pad circuit with a ground voltage and with the positive supply voltage.

10. The output pad system as claimed in claim 9, wherein voltage pump circuit comprises:
    an oscillator for generating at least a first phase signal; and
    a charge pump set for generating the negative supply voltage, wherein the charge pump converts the positive supply voltage into the negative supply voltage according to a voltage level of the first phase signal.

11. The output pad system as claimed in claim 10, wherein the oscillator is a multiple stage oscillator comprising:
    a first inverter for outputting the first phase signal;
    a second inverter, electrically connected to the first inverter, for outputting a second phase signal; and
    a third inverter, electrically connected between the second inverter and the first inverter, for outputting a third phase signal,
    whereby phases of the first phase signal, the second phase signal, and the third phase signal are different.

12. The output pad system as claimed in claim 11, wherein the charge pump set comprises a first charge pump which comprises:
    a first storage capacitor;
    a first switch being conductive or not-conductive according an inverted first phase signal inverted form the first phase signal, wherein the first switch is electrically connected between a first end of the first storage capacitor and a ground terminal providing the ground voltage;
    a second switch being conductive or not-conductive according the first phase signal, wherein the second switch is electrically connected between a second end of the first storage capacitor and the ground terminal;
    a third switch being conductive according the inverted first phase signal inverted form the first phase signal, wherein the third switch is electrically connected to the second end of the first storage capacitor and a supply terminal providing the positive supply voltage; and
    a fourth switch being conductive according the first phase signal, wherein the fourth switch is electrically connected between a load and the first end of the first storage capacitor.

13. The output pad system as claimed in claim 12, wherein the charge pump set further comprises a second charge pump which comprises:
    a second storage capacitor;
    a fifth switch being conductive or not-conductive according an inverted second phase signal inverted form the second phase signal, wherein the fifth switch is electrically connected between a first end of the second storage capacitor and the ground terminal providing the ground voltage;

a sixth switch being conductive or not-conductive according to the second phase signal, wherein the sixth switch is electrically connected between a second end of the second storage capacitor and the ground terminal;

a seventh switch being conductive or not-conductive according the inverted second phase signal, wherein the seventh switch is electrically connected to the second end of the second storage capacitor and the supply terminal providing the positive supply voltage; and an eighth switch being conductive or not-conductive according the second phase signal, wherein the eighth switch is electrically connected between the load and the first end of the second storage capacitor.

14. The output pad system as claimed in claim 9, wherein the pad circuit comprises:

a P channel Metal-Oxide Semiconductor field effect transistor driven by the first buffer series; and an N channel Metal-Oxide Semiconductor field effect transistor electrically connected to the first P channel Metal-Oxide Semiconductor field effect transistor, wherein the N channel Metal-Oxide Semiconductor field effect transistor is driven by the second buffer series.

15. The output pad system as claimed in claim 14, wherein the first buffer series comprises an even number of first inverters for receiving the positive supply voltage and the negative supply voltage to drive the pad circuit.

16. The output pad system as claimed in claim 14, wherein the second buffer series comprises an odd number of second inverters for receiving the positive supply voltage and the ground voltage to drive the pad circuit.

* * * * *